(12) United States Patent
He

(10) Patent No.: US 9,706,645 B2
(45) Date of Patent: Jul. 11, 2017

(54) L-BENDING PCB

(71) Applicant: Shenzhen China Star Optoelectronics Technology Co., Ltd., Shenzhen, Guangdong (CN)

(72) Inventor: Hu He, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 215 days.

(21) Appl. No.: 14/428,358

(22) PCT Filed: Jan. 7, 2015

(86) PCT No.: PCT/CN2015/070305
§ 371 (c)(1),
(2) Date: Mar. 14, 2015

(87) PCT Pub. No.: WO2016/082315
PCT Pub. Date: Jun. 2, 2016

(65) Prior Publication Data
US 2016/0353564 A1 Dec. 1, 2016

(30) Foreign Application Priority Data

Nov. 27, 2014 (CN) .......................... 2014 1 0707847

(51) Int. Cl.
*H05K 1/02* (2006.01)
*H05K 3/00* (2006.01)
*H05K 1/05* (2006.01)

(52) U.S. Cl.
CPC ............ *H05K 1/028* (2013.01); *H05K 1/0298* (2013.01); *H05K 1/05* (2013.01); *H05K 3/0061* (2013.01); *H05K 1/0203* (2013.01); *H05K 1/0284* (2013.01); *H05K 2201/066* (2013.01); *H05K 2201/09009* (2013.01); *H05K 2201/10106* (2013.01); *H05K 2201/10409* (2013.01); *H05K 2201/10553* (2013.01)

(58) Field of Classification Search
None
See application file for complete search history.

(56) References Cited

U.S. PATENT DOCUMENTS

| | | | | |
|---|---|---|---|---|
| 4,858,073 A * | 8/1989 | Gregory | ............... | H01L 23/142 174/254 |
| 5,265,322 A * | 11/1993 | Fisher | .................... | H05K 1/028 29/832 |
| 5,398,128 A * | 3/1995 | Tajima | .................. | H01L 23/145 257/E23.007 |
| 6,379,159 B1 * | 4/2002 | Mune | .................... | H01L 21/486 257/E23.067 |
| 6,501,661 B1 * | 12/2002 | Moore | ................. | H05K 1/0278 361/736 |

(Continued)

*Primary Examiner* — Jeremy C Norris
*Assistant Examiner* — Muhammed Azam
(74) *Attorney, Agent, or Firm* — Andrew C. Cheng

(57) ABSTRACT

A L-Bending PCB includes a straight portion and a bending portion connecting to the straight portion, the straight portion has a metal substrate bottom, an insulation layer, a conductive layer and a protective layer. The insulation layer is disposed on a partial surface of the metal substrate bottom, the conductive layer is disposed on the insulation layer and the protective layer is disposed on the conductive layer.

14 Claims, 5 Drawing Sheets

(56) References Cited

U.S. PATENT DOCUMENTS

| | | | | |
|---|---|---|---|---|
| 6,532,157 B1* | 3/2003 | Glenn | H01L 31/0203 | 174/255 |
| 6,856,506 B2* | 2/2005 | Doherty | G06F 1/1632 | 16/329 |
| 6,927,344 B1* | 8/2005 | Gall | H05K 1/0278 | 174/254 |
| 6,992,376 B2* | 1/2006 | Jaeck | H01L 23/5387 | 174/254 |
| 7,154,761 B1* | 12/2006 | Camerlo | H05K 1/0263 | 361/788 |
| 7,450,398 B2* | 11/2008 | Oh | H05K 1/148 | 361/749 |
| 7,558,073 B2* | 7/2009 | Lim | H05K 7/1422 | 361/721 |
| RE42,429 E* | 6/2011 | Haba | H01L 23/36 | 326/30 |
| 9,019,710 B2* | 4/2015 | Jeziorek | H05K 3/0061 | 174/254 |
| 9,117,991 B1* | 8/2015 | Olson | H01L 33/642 | |
| 9,326,382 B2* | 4/2016 | Park | H05K 1/0284 | |
| 9,462,686 B2* | 10/2016 | Na | H05K 1/028 | |
| 2001/0018799 A1* | 9/2001 | Lauffer | H01L 21/4803 | 29/846 |
| 2002/0012762 A1* | 1/2002 | Bunyan | H01L 23/36 | 428/40.2 |
| 2002/0033524 A1* | 3/2002 | Toyosawa | H01L 23/49572 | 257/678 |
| 2004/0038496 A1* | 2/2004 | Lee | H01L 21/486 | 438/455 |
| 2004/0040327 A1* | 3/2004 | Iida | H01L 23/367 | 62/259.2 |
| 2004/0238206 A1* | 12/2004 | Reid | H01L 23/5387 | 174/254 |
| 2004/0251231 A1* | 12/2004 | Takahira | H05K 3/306 | 216/13 |
| 2004/0264148 A1* | 12/2004 | Burdick, Jr. | H01L 25/0657 | 361/748 |
| 2005/0162840 A1* | 7/2005 | Morita | H05K 1/028 | 361/784 |
| 2006/0268530 A1* | 11/2006 | Nagao | H05K 1/028 | 361/749 |
| 2007/0212906 A1* | 9/2007 | Clayton | H01L 25/50 | 439/77 |
| 2009/0032295 A1* | 2/2009 | Okajima | H05K 1/028 | 174/260 |
| 2010/0230789 A1* | 9/2010 | Yorita | H01L 23/3121 | 257/659 |
| 2011/0284275 A1* | 11/2011 | Bagung | H05K 1/0278 | 174/257 |
| 2012/0055698 A1* | 3/2012 | Won | H05K 3/205 | 174/251 |
| 2012/0090881 A1* | 4/2012 | Sugiura | H05K 1/05 | 174/257 |
| 2013/0249740 A1* | 9/2013 | Shedletsky | H01Q 1/38 | 343/700 MS |
| 2014/0043577 A1* | 2/2014 | Kim | H05K 1/11 | 349/150 |
| 2014/0146435 A1* | 5/2014 | Stephanou | H01G 5/40 | 361/290 |
| 2014/0192514 A1* | 7/2014 | Hu | G02F 1/1336 | 362/97.1 |
| 2014/0254111 A1* | 9/2014 | Yamazaki | H01L 51/0097 | 361/749 |
| 2015/0237708 A1* | 8/2015 | Yano | H05K 1/0203 | 174/258 |
| 2015/0300609 A1* | 10/2015 | Hu | G02F 1/133603 | 362/97.1 |

* cited by examiner

L-BENDING PCB

FIELD OF THE INVENTION

The present invention relates to printing circuit board (PCB) manufacturing technology field, in particular, to a L-Bending printing circuit board (L-Bending PCB).

BACKGROUND OF THE INVENTION

The Flat Panel Display is driven to blooming developments with evolutions of photoelectric and semiconductor technologies, and Liquid Crystal Display (referred to as LCD) among a lot of panel displays has become the mainstream on the market due to many superior characteristics like high space utilization, low energy consumption, radiation-free and low electromagnetic interference.

LCD usually includes Liquid Crystal Panel and Black Light Module (referred to as BL). Because Liquid Crystal Panel is without a characteristic of self-illumination, it is necessary to dispose BL under the Liquid Crystal Panel to provide a surface light source the Liquid Crystal Panel needs, therefore Liquid Crystal Panel can display images via the surface light source provided by the Liquid Crystal Panel.

Present BL is mainly divided into the side-light type backlight module and the direct-light type backlight module by lighting methods. In recent years, bezel slimming of the BL is required correspondingly with requirements of bezel slimming of LCD. A new model of a L-Bending printing circuit board (L-Bending PCB) is applied in the side-light type backlight module to achieve bezel slimming.

Because the L-Bending PCB is Metal Core Printed Circuit Board (referred to as MCPCB), which is more expensive to be utilized in large area and to provide a large heat-dispersing area. In present technologies, the L-Bending PCB usually connects to heat-dispersing elements to increase heat-dispersing ability. FIG. 1 is a structural schematic diagram which shows that a heat-dispersing element is utilized to connect to a L-Bending PCB. Refer to FIG. 1, the L-Bending PCB 110 comprises a plane board 111 and a vertical board 122 vertically connecting to the plane board 111. A heat-dispersing element is disposed on the plane board 111, and locked with the plane board 111 together by a screw 130. The vertical board is used to connect a light source 140, and the light source can be a light emitting diode (LED).

FIG. 2 is a sectional diagram of a straight portion along A-A line in FIG. 1. Refer to FIG. 2, the plane board comprises: a metal substrate bottom 111-a, an insulation layer 111-b, a conductive layer 111-c, and a protective layer 111-d. The insulation layer 111-b is disposed between the metal substrate bottom 111-a and the conductive layer 111-c to insulate the metal substrate bottom 111-a and the conductive layer 111-c and prevent both of them form forming shorting. The protective layer 111-d disposed on the conductive layer 111-c to confirm the conductive layer in insulating from the conductive layer 111-c. When the heat dispersing element is disposed 120 on the plane board 111, because of low heat conductivities of the insulation layer 111-b and the protective layer 111-d, the heat-dispersing-rate of the heat-dispersing element is reducing; furthermore, because of a weaker mechanical strength of the protective layer 111-d, when the heat-dispersing element 120 and the plane board 111 are locked together by utilizing a screw 120, the protective layer 111-d is damaged extremely easily to expose the conductive layer 111-c, the conductive layer 111-c and the heat dispersing element 120 are contacting together directly to form leakage, and the conductive layer 111-c is caused in shorting extremely easily as well.

SUMMARY

In order to solve the existing problem of the aforementioned present technology, an objective the present invention is to provide a L-Bending printing circuit board (L-Bending PCB) comprising a straight portion and a bending portion connecting to the straight portion, the straight portion comprises a metal substrate bottom, an insulation layer, a conductive layer and a protective layer, wherein, the insulation layer is disposed on a partial surface of the metal substrate bottom, the conductive layer is disposed on the insulation layer and the protective layer is disposed on the conductive layer.

Further, the insulation layer is disposed around a side end of a surface of the metal substrate bottom, and the insulation layer remains to be open.

Further, the insulation layer is disposed on three side ends of a surface of the metal substrate bottom.

Further, the insulation layer is T-shaped, wherein, a cap body of the T-shaped insulation layer is disposed at a side end of a surface of the metal substrate bottom.

Further, the straight portion connects to the bending portion vertically.

Another objective of the present invention is to provide a L-Bending printing circuit board (L-Bending PCB) comprises a straight portion and a bending portion connecting to the straight portion, the straight portion comprises a metal substrate bottom, an insulation layer, a conductive layer and a protective layer, wherein, a surface of the metal substrate bottom comprises a heat-dispersing region and a wiring region, the insulation layer is disposed within the wiring region, the conductive layer is disposed on the insulation layer and the protective layer is disposed on the conductive layer.

Further, the heat-dispersing region is surrounded by the wiring region, and the wiring region remains to be open.

Further, the wiring region is three side ends of a surface of the metal substrate bottom.

Further, the wiring region is T-shaped, wherein, a cap body of the T-shaped wiring region is disposed at a side end of a surface of the metal substrate bottom.

Further, the straight portion connects to the bending portion vertically.

The beneficial effects of the present invention: when improving the heat dissipation of the L-Bending PCB by retainingly connecting the heat-dispersing element and the metal substrate bottom together, the reliability of the L-Bending PCB is increasing at the same time.

BRIEF DESCRIPTION OF THE DRAWING

Other aspects, features and advantages of embodiments of the present invention will be apparent from the following detailed description taken in connection to the accompanying drawings. In the drawings.

DETAILED DESCRIPTION OF THE EMBODIMENT

Hereinafter, detailed descriptions will be set forth for embodiments of the invention in conjunction with the accompanying drawings. However, there are many different ways to practice the present invention, and the present invention should not be explained to limit the described embodiment hereinafter. On the contrary, these provided embodiments are for explain principles and the practical applications of the present invention for those skilled in the art to understand various embodiments of the present invention and various modifications of properly specifical expectation.

It will be understood that, although the terms first, second, etc. may be used hereto describe various elements, these elements should not be limited by these terms. There terms are only used to distinguish one element from another.

Figure 1:
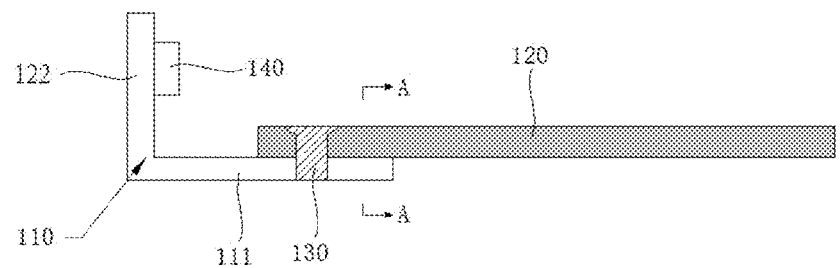
FIG. 1 is a structural schematic view of connecting to the L-Bending printing circuit board (L-Bending PCB) together by utilizing a heat-dispersing element in the present invention.
Figure 2:
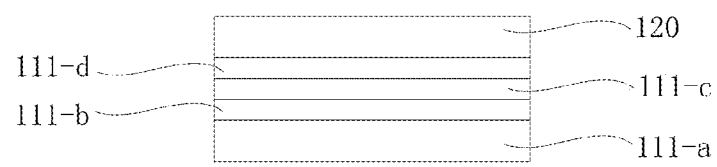
FIG. 2 is a sectional view along A-A line of the straight portion in FIG. 1.
Figure 3:
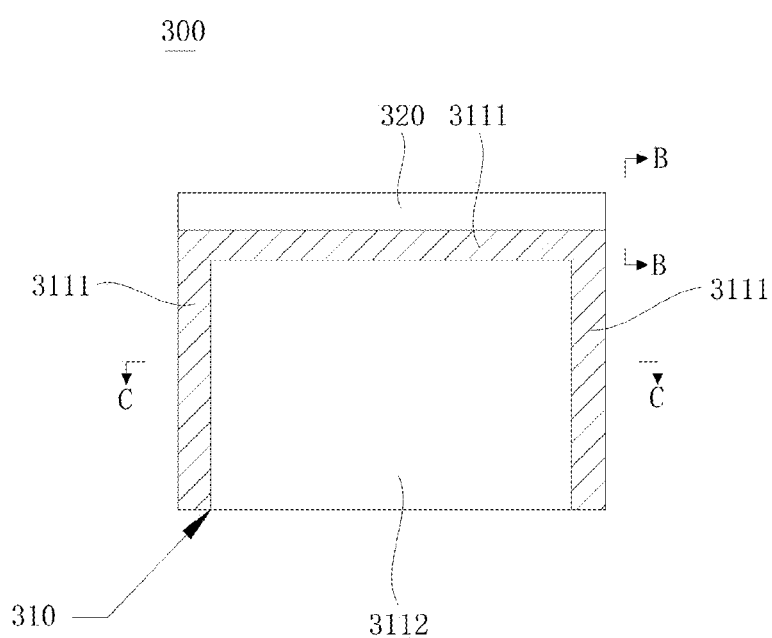
FIG. 3 is a top view of the L-Bending PCB according to the first embodiment of the present invention.
Figure 4:
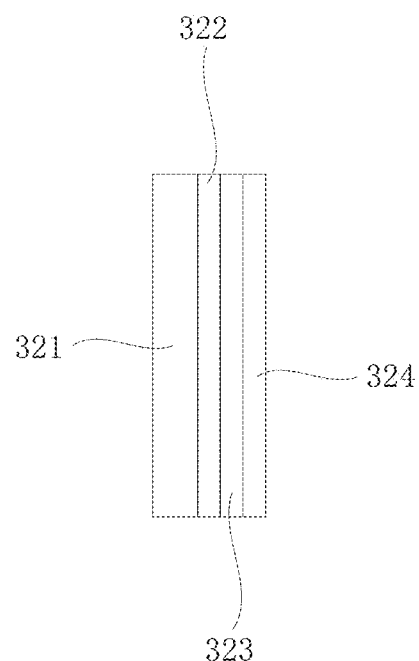
FIG. 4 is a sectional view along B-B line of a bending portion in FIG. 3.
Figure 5:
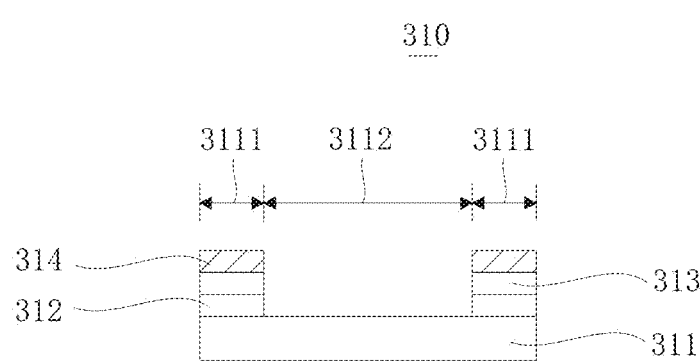
FIG. 5 is a sectional view along C-C line in FIG. 3.
Figure 6:
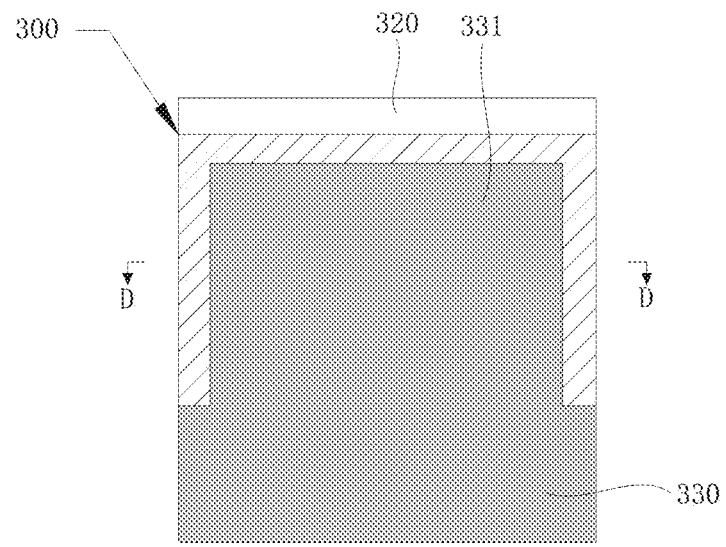
FIG. 6 is a top view of connecting the L-Bending PCB to the heat-dispersing element according to the first embodiment of the present invention.
Figure 7:
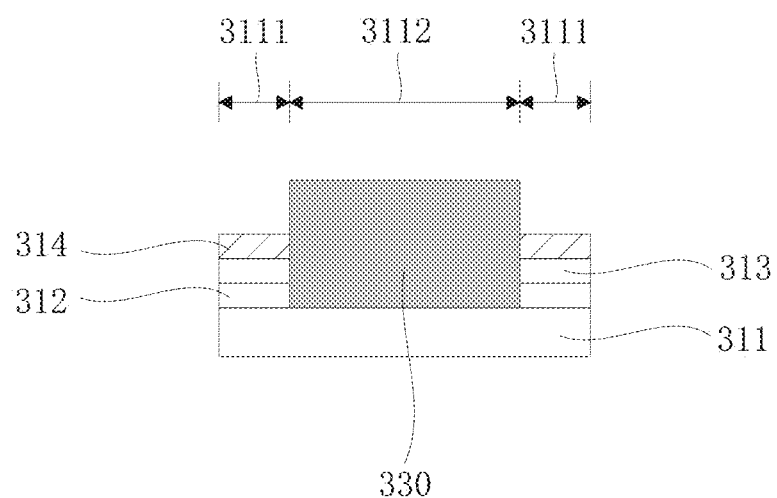
FIG. 7 is a sectional view along D-D line in FIG. 6.

FIG. 3 is a top view of the L-Bending PCB according to the first embodiment of the present invention. FIG. 4 is a sectional view along B-B line of a bending portion in FIG. 3. FIG. 5 is a sectional view along C-C line in FIG. 3. FIG. 6 is a top view of connecting the L-Bending PCB to the heat-dispersing element according to the first embodiment of the present invention. FIG. 7 is a sectional view along D-D line in FIG. 6.

Refer to FIG. 3 to FIG. 6, a L-Bending printing circuit board (L-Bending PCB) 300 according to the first embodiment of the present invention is L-shaped as a whole, which comprises a straight portion 310 and a bending portion 320 connecting to the straight portion 310. In particular, the straight portion 310 connects to the bending portion 320 vertically according to the first embodiment of the present invention.

The bending portion 320 comprises a second metal substrate bottom 321, a second insulation layer 322, a second conductive layer 323 and a second protective layer 324. The second insulation layer 322 is covering on a surface of the second metal substrate bottom 321, the second conductive layer 323 is covering on a surface of the second insulation layer 322, and the second insulation layer 322 is used in insulating the second metal substrate bottom 321 and the second conductive layer 323 to prevent two of them forming shorting. The second protective layer 324 is covering on a surface of of the second conductive layer 323 to confirming that the second conductive layer 323 is insulating from outside surroundings. According to the first embodiment of the present invention, the metal substrate bottom 321 is preferred made of aluminium materials with good heat-dissipation, the second conductive layer 323 is preferred made of copper materials with good conductivity, but the present invention is not limited hereto.

The straight portion 311 comprises a first metal substrate bottom 311, a first insulation layer 312, a first conductive layer 313 and a first protective layer 314. The first insulation layer 312 is covering on a partial surface of the first metal substrate bottom 311, the first conductive layer 313 is covering on a surface of the first insulation layer 312, and the first insulation layer 312 is used in insulating the first metal substrate bottom 311 and the first conductive layer 313 to prevent two of them forming shorting. The first protective layer 314 is covering on a surface of the first conductive layer 313 to confirm that the first conductive layer 313 is insulating from outside surroundings. According to the first embodiment of the present invention, the metal substrate bottom 311 is preferred made of aluminium materials with good heat-dissipation, the second conductive layer 313 is preferred made of copper materials with good conductivity, but the present invention is not limited hereto.

According to the first embodiment of the present invention, a partial surface of the first metal substrate bottom 311 is for disposing a wiring region 3111 of conductive elements like wires, electrical conductive elements and etc., and a surface outside the partial surface of the first metal substrate bottom 311 is a heat-dispersing region 3112 for joining a heat-dispersing element 330.

Specifically, the first insulation layer 312 is disposed around a side end of a surface of the metal substrate bottom 311, and the first insulation layer 312 remains to be open. Preferably, the first insulation layer 312 is disposed on three side ends of a surface of the first metal substrate bottom 311. Thus, the heat-dispersing region 3112 is surrounded by the wiring region 3111, and the wiring region 3111 remains to be open. Preferably, three side ends of a surface of the metal substrate bottom 311 is the wiring region 3111.

Thus, a terminal of the heat-dispersing element 330 can be machined to form a shape with convex-middle and two concave-side-ends. When joining the L-Bending PCB of the first embodiment of the first invention with the heat-dispersing element 330, passing a bump 331 of the heat-dispersing element 330 through a open the wiring region 3111 and contact directly to the heat-dispersing region 3112, and locking the bump 311 directly with the first metal substrate bottom 311 together by a screw to increase whole heat dissipation of the L-Bending PCB according to the first embodiment of the present invention. At the same time, because the heat-dispersing element 330 is not locking to the wiring region 3111 by the screw, once the first protective layer is damaged, there is no leakage situation because caused from direct contacting the first conductive layer 313 and the heat-dispersing element 330, and no shorting phenomenon causing from the first conductive layer 313; therefore, reliabilities of the L-Bending PCB according to the first embodiment of the present invention can be increasing.

Figure 12:
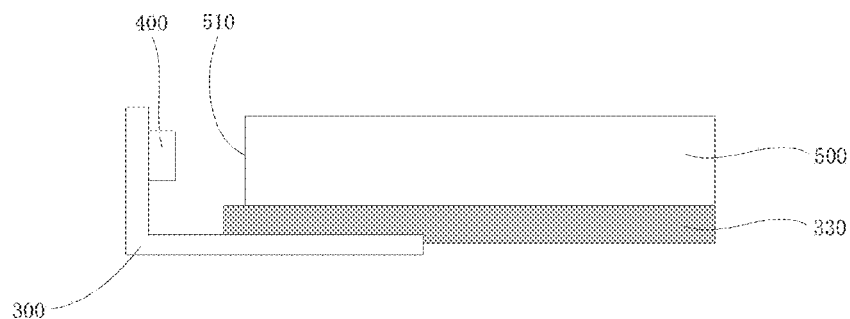
FIG. 12 is a structural schematic view of a backlight according to the first embodiment of the present invention.

FIG. 12 is a structural schematic view of a backlight according to the first embodiment of the present invention.

Refer to FIG. 12, a backlight module according to the first embodiment of the present invention comprises: a L-Bending PCB 300, a heat-dispersing element 330, a light source 400 and a light-conducting board 500.

Specifically, the heat-dispersing element 330 and the L-Bending PCB 300 are processed joining assembly by a joining method referred to FIG. 6 and FIG. 7, the light-conducting board 500 is disposed on the heat-dispersing element 330, the light source 400 is disposed on the bending portion 320, and the light source 400 is disposed correspondingly to a light input surface 510 of the light conducting board 500.

That the backlight module according to the first embodiment of the present invention further comprises other optical portions should be understood, the optical portions should be familiar to those skilled in the art, and detailed description will be omitted here for simplicity and clarity.

Figure 8:
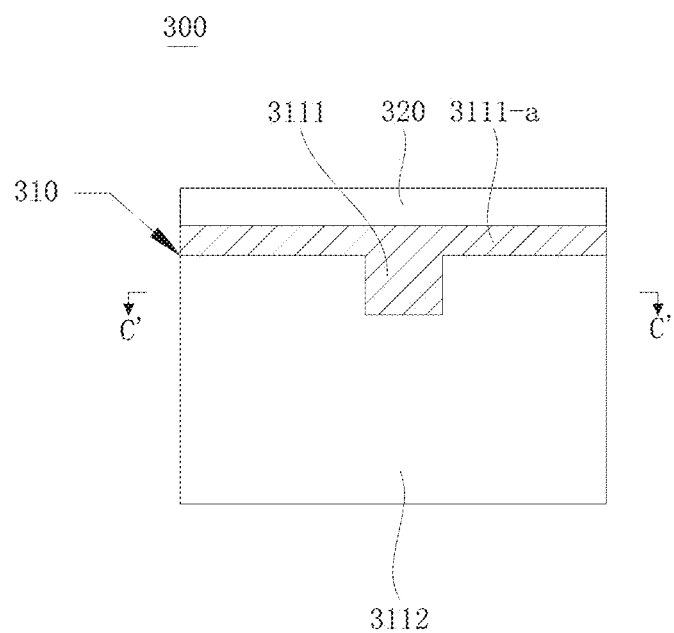
FIG. 8 is a top view of the L-Bending PCB according to the second embodiment of the present invention.
Figure 9:
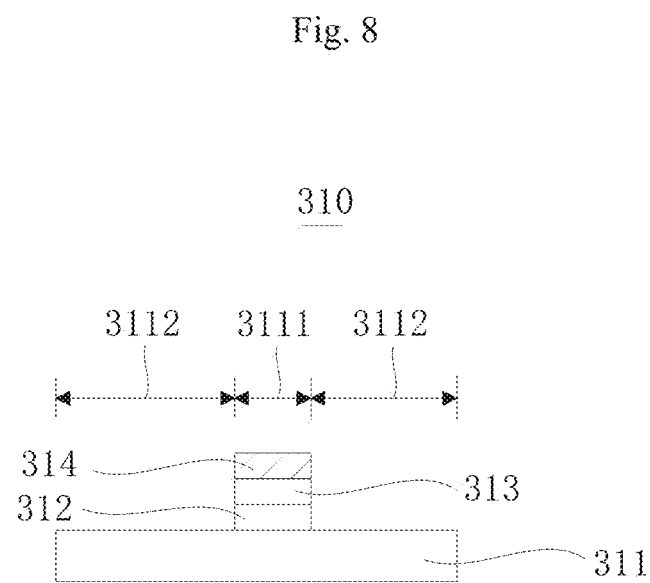
FIG. 9 is a sectional view along C'-C' line in FIG. 8.
Figure 10:
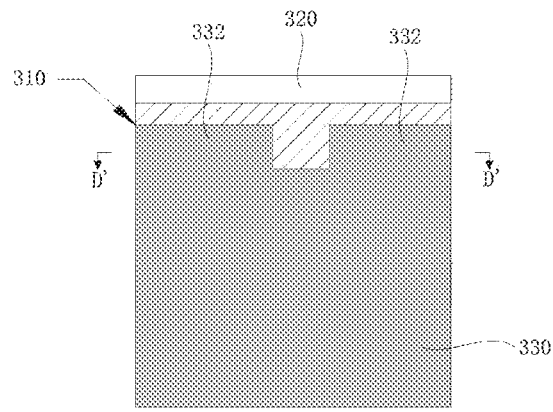
FIG. 10 is a top view of connecting the L-Bending PCB to the heat-dispersing element according to the second embodiment of the present invention.
Figure 11:
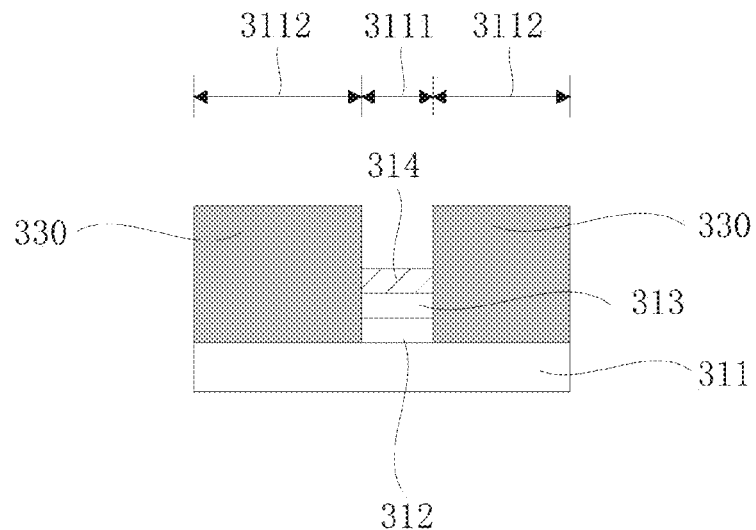
FIG. 11 is a sectional view along D'-D' line in FIG. 10.

FIG. 8 is a top view of the L-Bending PCB according to the second embodiment of the present invention. FIG. 9 is a sectional view along C'-C' line in FIG. 8. FIG. 10 is a top view of connecting the L-Bending PCB to the heat-dispersing element according to the second embodiment of the present invention. FIG. 11 is a sectional view along D'-D' line in FIG. 10.

According to the second embodiment of the present invention, the same parts according to the first embodiment of the present invention will not be detailed describing hereinafter. Refer to FIG. 8 to FIG. 11, differences between the second embodiment according to the present invention and the first embodiment according to the present invention are: the first insulation layer 312 is T-shaped, wherein, a cap body of the T-shaped first insulation layer 312 is disposed at a side end of a surface of the first metal substrate bottom 311. Correspondingly, the wiring region 3111 is also T-shaped, wherein, a cap body 3111-a of the T-shaped wiring region is disposed at a side end of a surface of the metal substrate bottom.

A terminal of the heat-dispersing element 330 can be machined to form a shape with a concave-middle and two convex-side-ends. When joining the L-Bending PCB of the second embodiment of the first invention with the heat-dispersing element 330, disposing bumps 332 of two sides of the heat-dispersing element 330 at two sides of a straight body of the T-shaped first insulation layer 312, and have the straight body of the T-shaped first insulation layer 312 located at the concave portion of the heat-dispersing element 330; therefore, the heat-dispersing element 330 and the first metal substrate bottom 311 can be locking directly together.

While the invention has been shown and described with reference to certain exemplary embodiments thereof, it will be understood by those skilled in the art that various changes in form and details may be made therein without departing from the spirit and scope of the invention as defined by the appended claims and their equivalents.

The invention claimed is:

1. A L-Bending printing circuit board (L-Bending PCB) comprises a straight portion and a bending portion connecting to the straight portion, the straight portion comprises a metal substrate bottom, an insulation layer, a conductive layer and a protective layer, wherein the insulation layer is T-shaped, a cap body of the T-shaped insulation layer is disposed at a side end of a surface of the metal substrate bottom, the insulation layer is disposed on a partial surface of the metal substrate bottom, the conductive layer is disposed on the insulation layer and the protective layer is disposed on the conductive layer.

2. The L-Bending PCB according to claim 1, wherein the insulation layer is disposed around a side end of a surface of the metal substrate bottom, and the insulation layer remains to be open.

3. The L-Bending PCB according to claim 2, wherein the insulation layer is disposed on three side ends of a surface of the metal substrate bottom.

4. A L-Bending printing circuit board (L-Bending PCB) comprises a straight portion and a bending portion connecting to the straight portion, the straight portion comprises a metal substrate bottom, an insulation layer, a conductive layer and a protective layer, wherein a surface of the metal substrate bottom comprises a heat-dispersing region and a wiring region, the insulation layer is disposed within the wiring region, the conductive layer is disposed on the insulation layer and the protective layer is disposed on the conductive layer.

5. The L-Bending PCB according to claim 1, wherein the straight portion connects to the bending portion vertically.

6. The L-Bending PCB according to claim 2, wherein the straight portion connects to the bending portion vertically.

7. The L-Bending PCB according to claim 3, wherein the straight portion connects to the bending portion vertically.

8. The L-Bending PCB according to claim 4, wherein the heat-dispersing region is surrounded by the wiring region, and the wiring region remains to be open.

9. The L-Bending PCB according to claim 8, wherein the wiring region is three side ends of a surface of the metal substrate bottom.

10. The L-Bending PCB according to claim 4, wherein the wiring region is T-shaped, wherein, a cap body of the T-shaped wiring region is disposed at a side end of a surface of the metal substrate bottom.

11. The L-Bending PCB according to claim 4, wherein the straight portion connects to the bending portion vertically.

12. The L-Bending PCB according to claim 8, wherein the straight portion connects to the bending portion vertically.

13. The L-Bending PCB according to claim 9, wherein the straight portion connects to the bending portion vertically.

14. The L-Bending PCB according to claim 10, wherein the straight portion connects to the bending portion vertically.

* * * * *